United States Patent
Jeong et al.

(10) Patent No.: US 8,432,742 B2
(45) Date of Patent: Apr. 30, 2013

(54) NON-VOLATILE MEMORY DEVICE, SYSTEM, AND CELL ARRAY

(75) Inventors: Chang-Min Jeong, Yongin-si (KR); Hee-Seog Jeon, Suwon-si (KR); Hyun-Khe Yoo, Suwon-si (KR); Ji-Do Ryu, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 13/114,120

(22) Filed: May 24, 2011

(65) Prior Publication Data

US 2012/0044772 A1 Feb. 23, 2012

(30) Foreign Application Priority Data

Aug. 18, 2010 (KR) ........................ 10-2010-0079764

(51) Int. Cl.
*G11C 11/34* (2006.01)
(52) U.S. Cl.
USPC .................................................. 365/185.23

(58) Field of Classification Search ............. 365/185.23, 365/189.09
See application file for complete search history.

(56) References Cited

U.S. PATENT DOCUMENTS

| 6,850,438 | B2 * | 2/2005 | Lee et al. ................. 365/185.11 |
| 2006/0071265 | A1 * | 4/2006 | Koh et al. ..................... 257/315 |

FOREIGN PATENT DOCUMENTS

| JP | 2002-043447 | 2/2002 |
| JP | 2005-236139 | 9/2005 |

* cited by examiner

*Primary Examiner* — Anthan Tran
(74) *Attorney, Agent, or Firm* — Volentine & Whitt, PLLC

(57) ABSTRACT

A non-volatile memory cell array, comprising sector selection transistors controlled by a voltage applied to sector selection lines, first through fourth memory cells connected in series to the sector selection transistors, a first common source line connected between the first memory cell and the second memory cell, and a second common source line connected between the third memory cell and the fourth memory cell and separated from the first common source line. A first voltage is applied to the first common source line, and a second voltage different from the first voltage is applied to the second common source line.

15 Claims, 7 Drawing Sheets

NON-VOLATILE MEMORY DEVICE, SYSTEM, AND CELL ARRAY

CROSS-REFERENCE TO RELATED APPLICATIONS

This application claims priority under 35 U.S.C. §119 to Korean Patent Application No. 10-2010-0079764 filed on Aug. 18, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to non-volatile memory devices, systems, and cell arrays.

Semiconductor memory devices can be roughly divided into two categories according to whether they retain stored data when disconnected from power. These categories include volatile memory devices, which lose stored data when disconnected from power, and non-volatile memory devices, which retain stored data when disconnected from power. Examples of volatile memory devices include dynamic random access memory (DRAM) and static random access memory (SRAM). Examples of non-volatile memory devices include masked read-only memory (MROM), programmable read-only memory (PROM), erasable programmable read-only memory (EPROM), and electrically erasable programmable read-only memory (EEPROM).

Non-volatile memory devices have achieved increasing popularity in recent years due to improvements in performance, as well as the proliferation of portable electronic devices. Accordingly, to satisfy increasing demand, researchers continue to seek new ways to improve the performance and storage capacity of non-volatile memory devices.

SUMMARY OF THE INVENTION

According to one embodiment of the inventive concept, a non-volatile memory cell array comprises sector selection transistors controlled by a voltage applied to sector selection lines, first through fourth memory cells connected in series to the sector selection transistors, a first common source line connected between the first memory cell and the second memory cell, and a second common source line connected between the third memory cell and the fourth memory cell and separated from the first common source line. A first voltage is applied to the first common source line, and a second voltage different from the first voltage is applied to the second common source line.

According to another embodiment of the inventive concept, a non-volatile memory device comprises a memory cell array comprising memory cells formed by arranging word lines, selection lines and bit lines, and common source lines separated from each other, a common source driver that applies a first voltage to any one of the common source lines and applies a second voltage different from the first voltage to other common source lines, a voltage generating circuit that supplies the first and second voltages to the common source driver, and a control circuit that controls the voltage generating circuit and the common source driver.

According to another embodiment of the inventive concept, a non-volatile memory system comprises a non-volatile memory device and a memory controller that controls the non-volatile memory device. The non-volatile memory device comprises a memory cell array comprising memory cells, word lines, selection lines and bit lines, and common source lines separated from each other, a common source driver that applies a first voltage to one of the common source lines and a second voltage different from the first voltage to other common source lines, a voltage generating circuit that supplies the first and second voltages to the common source driver, and a control circuit that controls the voltage generating circuit and the common source driver.

These and other embodiments of the inventive concept can improve the performance of a non-volatile memory device by enhancing the disturbance characteristics of memory cells located adjacent to a programmed memory cell.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the term "and/or" indicates any and all combinations of one or more of the associated listed items. Unless specially defined, all terms (including technical and scientific terms) are to be interpreted according to their meaning as understood by one of ordinary skill in the art. Moreover, terms are not to be interpreted in an overly idealized manner unless expressly so defined herein.

Figure 1:
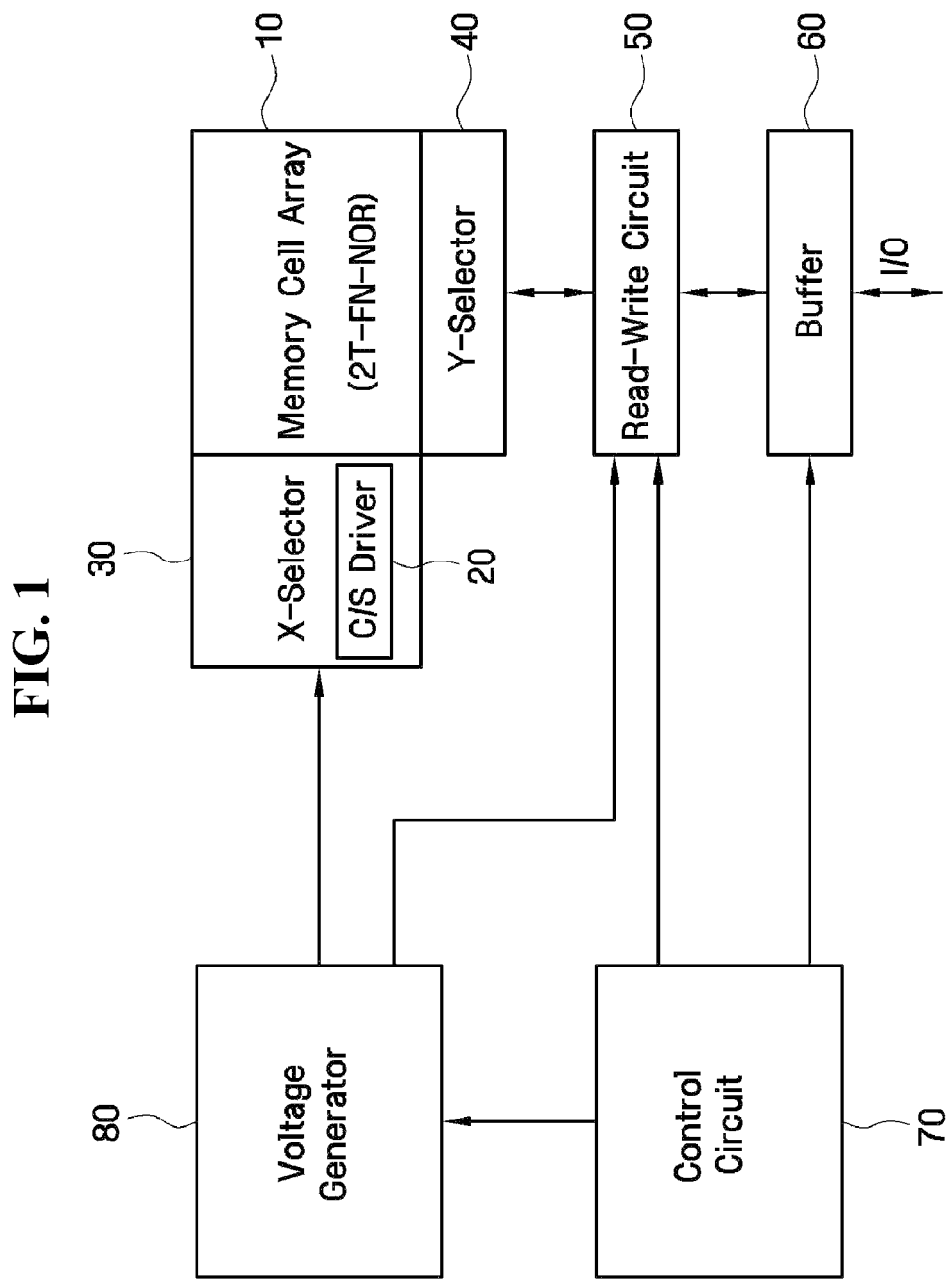
FIG. 1 is a block diagram illustrating a non-volatile memory device in accordance with an embodiment of the inventive concept.
Figure 2:
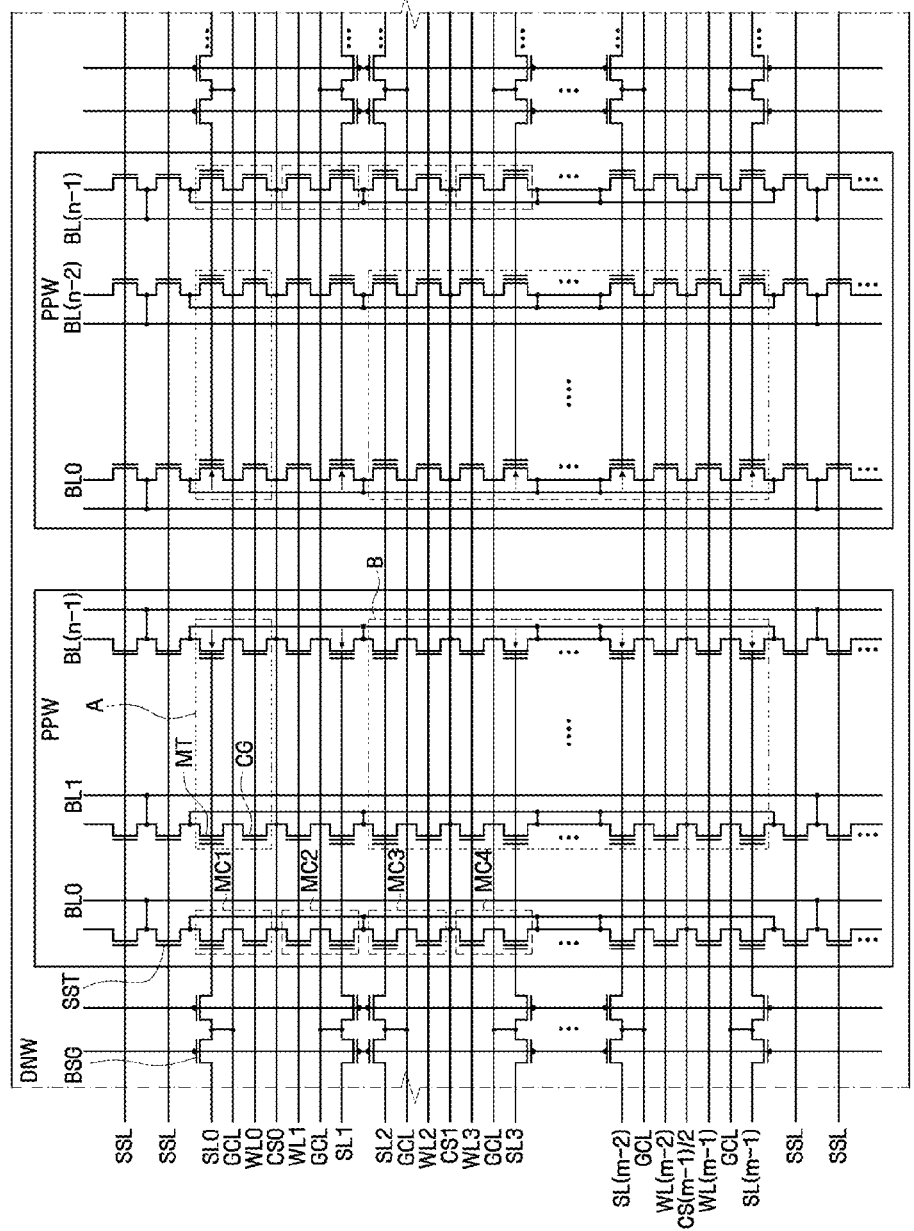
FIG. 2 is a circuit diagram illustrating a non-volatile memory cell array in accordance with an embodiment of the inventive concept.
Figure 3:
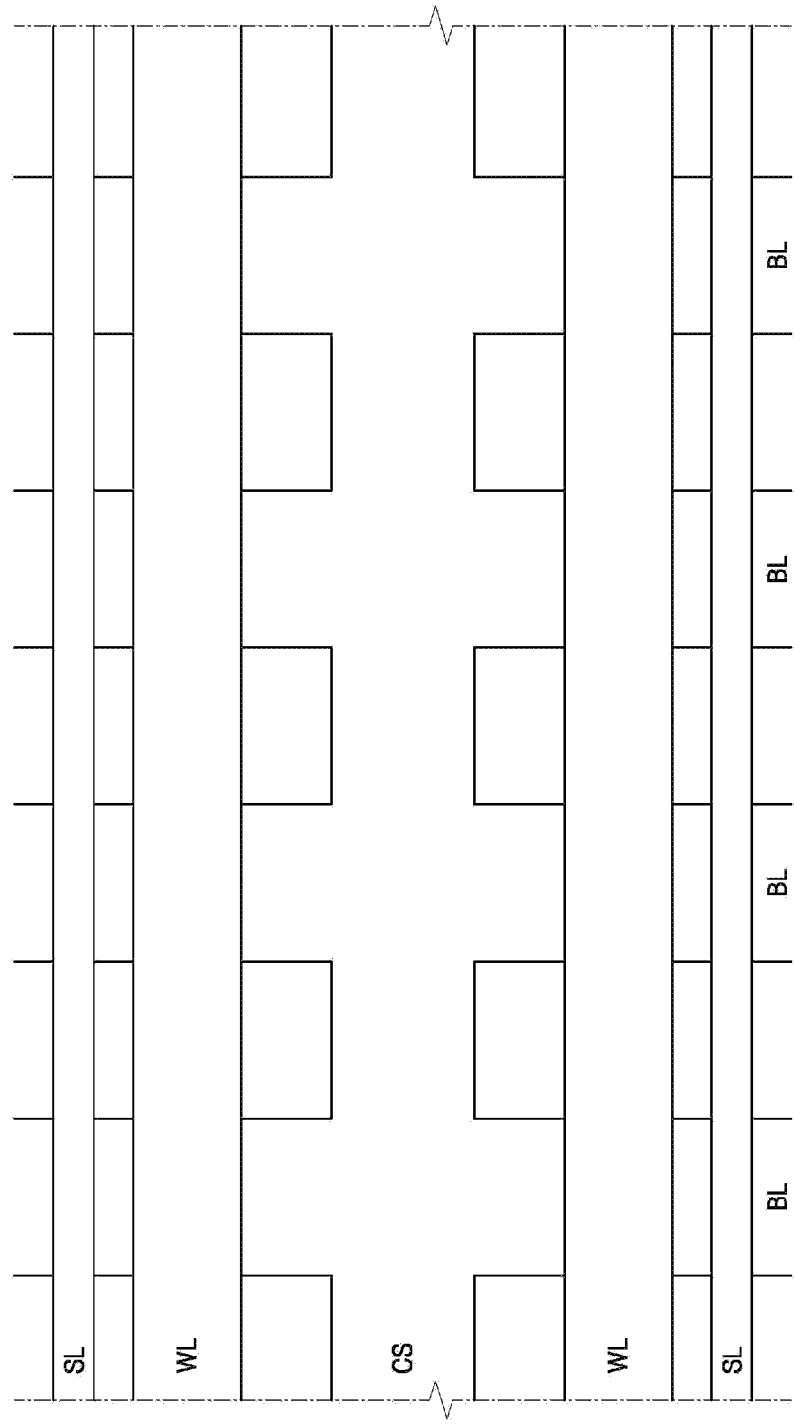
FIG. 3 is a plan view of a non-volatile memory cell array in accordance with an embodiment of the inventive concept.

FIGS. 1 through 3 illustrate a non-volatile memory device and a non-volatile memory cell array in accordance with embodiments of the inventive concept. In particular, FIG. 1 is a block diagram illustrating a non-volatile memory device in accordance with an embodiment of the inventive concept, FIG. 2 is a circuit diagram illustrating a non-volatile memory cell array in accordance with an embodiment of the inventive concept, and FIG. 3 is a plan view of the non-volatile memory cell array in accordance with the embodiment of the inventive concept.

Referring to FIG. 1, the non-volatile memory device comprises a memory cell array 10 that stores R-bit data information, where R is an integer greater than or equal to 1. In this embodiment, memory cell array 10 is a two-transistor (2T)-Fowler-Nordheim (FN)-NOR memory cell array. Memory cell array 10 comprises a plurality of memory cells arranged in a plurality of rows with corresponding word lines and selection lines, and arranged in a plurality of columns with corresponding bit lines. Memory cell array 10 further comprises a plurality of common source lines separated from each other.

Referring to FIG. 2, memory cell array 10 comprises sector selection transistors SST controlled by a voltage applied to sector selection lines SSL, first through fourth memory cells MC1 through MC4 connected in series to sector selection transistors SST, a first common source line CS0 connected between first memory cell MC1 and second memory cell MC2, and a second common source line CS 1 connected between third memory cell MC3 and fourth memory cell MC4 and separated from first common source line CS0.

Memory cell array 10 comprises a plurality of blocks corresponding to a plurality of pocket wells PPW arranged in a deep well DNW. Each of the blocks comprises a plurality of sectors each comprising a plurality of memory cells. Sector selection transistors SST are controlled by a voltage applied to sector selection lines SSL to select a specific sector among the sectors formed in pocket wells PPW or the corresponding blocks. FIG. 2 illustrates some sectors among the sectors formed in each of pocket wells PPW or the corresponding blocks; however, each block can comprise additional sectors that are not shown. In addition, sector selection transistors SST can be formed at both ends of one sector as shown in FIG. 2.

Each sector comprises a plurality of memory cells. The memory cells are connected in series to corresponding sector selection transistors SST as shown in FIG. 2. Further, the memory cells share bit lines BL0 through BL(n−1) through sector selection transistors SST. Accordingly, where sector selection transistors SST are turned on by a voltage applied to sector selection lines SSL, voltages applied to each of bit lines BL0 through BL(n−1) are applied to corresponding memory cells via sector selection transistors SST.

Memory cells arranged in the same row of a block form a page row. As examples, a first memory cell MC1 and memory cells arranged in the same row (memory cells in a region A) form one page row, and each of second through fourth memory cells MC2 through MC4 form one page row together with the memory cells arranged in their same respective rows. Memory cells arranged in the same page row share a selection line SL and a word line WL as shown in FIG. 2. Accordingly, a voltage applied to a global selection line GCL is applied to the memory cells arranged in the same page row via selection line SL by turning on a byte selection gate BSG. In a similar manner, a voltage applied to word line WL is applied to the memory cells arranged in the same page row.

Although first through fourth memory cells MC1 through MC4 are presented as examples, the following description can also be applied to other memory cells having a similar arrangement to first through fourth memory cells MC1 through MC4.

Each of first through fourth memory cells MC1 through MC4 comprises a memory transistor MT controlled by a voltage applied to the corresponding selection line SL. Memory transistor MT stores charges representing stored data. Each of first through fourth memory cells MC1 through MC4 further comprises a control gate CG controlled by a voltage applied to a word line WL and connected in series to memory transistor MT.

First memory cell MC1 comprises a memory transistor MT controlled by a voltage applied to a first selection line SL0 and a control gate CG controlled by a voltage applied to a first word line WL0 and connected in series to the memory transistor MT. Similarly, second memory cell MC2 comprises a memory transistor MT controlled by a voltage applied to a second selection line SL1 and a control gate CG controlled by a voltage applied to a second word line WL1 and connected in series to the memory transistor MT. Third memory cell MC3 comprises a memory transistor MT controlled by a voltage applied to a third selection line SL2 and a control gate CG controlled by a voltage applied to a third word line WL2 and connected in series to the memory transistor MT. Fourth memory cell MC4 comprises a memory transistor MT controlled by a voltage applied to a fourth selection line SL3 and a control gate CG controlled by a voltage applied to a fourth word line WL3 and connected in series to the memory transistor MT.

Each of first through fourth memory cells MC1 through MC4 is programmed by storing charges in its memory transistor MT by F-N tunneling, and is erased by discharging the charges stored in its memory transistor MT by F-N tunneling.

As shown in FIG. 2, first common source line CS0 is connected between control gate CG of first memory cell MC1 and control gate CG of second memory cell MC2. Second common source line CS1 is connected between control gate CG of third memory cell MC3 and control gate CG of fourth memory cell MC4. In addition, first and second common source lines CS0 and CS1 are formed separately from each other.

Although first and second common source lines CS0 and CS1, which are related to first through fourth memory cells MC1 through MC4, are described in relation to FIG. 2, the above description can also be applied to other common source lines and corresponding memory cells in memory cell array 10.

Referring to FIG. 3, common source lines CS are formed in parallel to word lines WL and selection lines SL and perpendicular to bit lines BL. Although common source lines CS are formed in parallel to word lines WL and selection lines SL and perpendicularly to bit lines BL in FIG. 3, the inventive concept is not limited thereto. In addition, the number of common source lines CS forming memory cell array 10 can be half the number of word lines WL forming memory cell array 10. For instance, supposing that the number of word lines WL is "m", the number of common source lines CS can be ½*m.

Referring again to FIG. 1, a row selector 30 selects a row (e.g., word line WL) of memory cell array 10 and a column selector 40 selects a column (e.g., bit line BL) of memory cell array 10. Row selector 30 comprises a common source driver 20 for applying a first voltage to any one of common source lines CS and a second voltage different from the first voltage to other common source lines.

Although FIG. 1 shows that common source driver 20 is incorporated in row selector 30, the inventive concept is not limited thereto. For instance, in other embodiments, common source driver 20 can be provided separate from row selector 30.

A read-write circuit 50 is controlled by a control circuit 70, and operates as a sense amplifier or a write driver according to different operation modes of the non-volatile memory device. For example, in a verify-read operation, read-write circuit 50 operates as a sense amplifier for reading program data from memory cell array 10. On the other hand, in a program or write operation, read-write circuit 50 operates as a write driver for driving columns of memory cell array 10 according to data to be stored in memory cell array 10.

A buffer 60 stores data provided from an external device (e.g., a memory controller or host) and loads the stored data into read-write circuit 50 in a program operation.

A voltage generator 80 generates voltages to be supplied to rows and columns of memory cell array 10 and voltages to be supplied to well regions in which the memory cells are formed according to different operation modes of the non-volatile memory device. Voltage generation operations of voltage generator 80 are controlled by control circuit 70.

Control circuit 70 controls operations of the non-volatile memory device by controlling, directly or indirectly, row selector 30, column selector 40, read-write circuit 50, buffer 60, and voltage generator 80. As examples, control circuit 70 can load data to be programmed from buffer 60 into read-write circuit 50, and voltage generator 80 can apply a program voltage to memory cell array 10 to program selected memory cells. Voltage generator 80 can also apply an erase voltage to memory cell array 10 to erase the selected memory cells.

Although not shown in FIG. 1, the non-volatile memory device can further comprise a pass/fail circuit (not shown) used in a verify operation of the selected memory cells.

Figure 4:
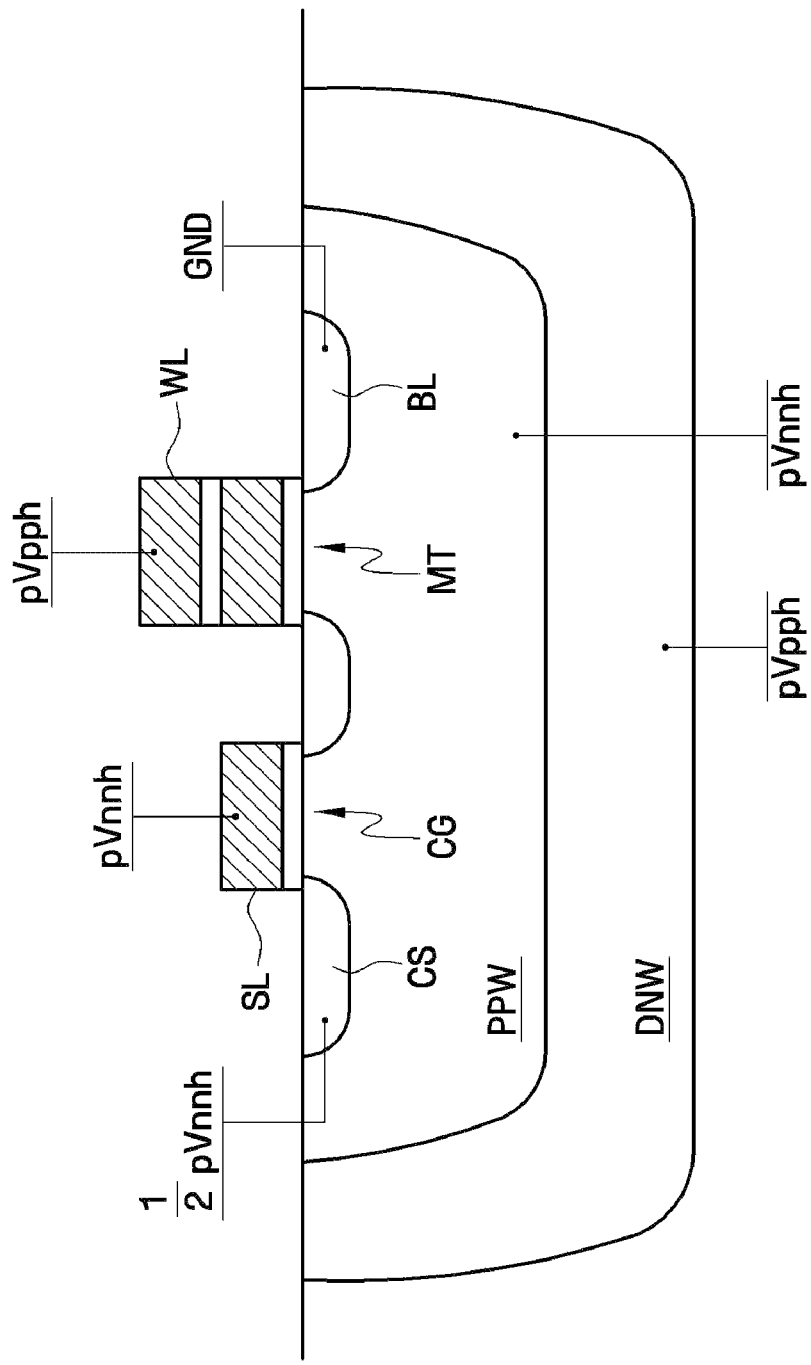
FIGS. 4 and 5 are diagrams for explaining disturbance characteristics of memory cells adjacent to a selected memory cell that is programmed in a program operation of the non-volatile memory device in accordance with the embodiment of the inventive concept.
Figure 5:
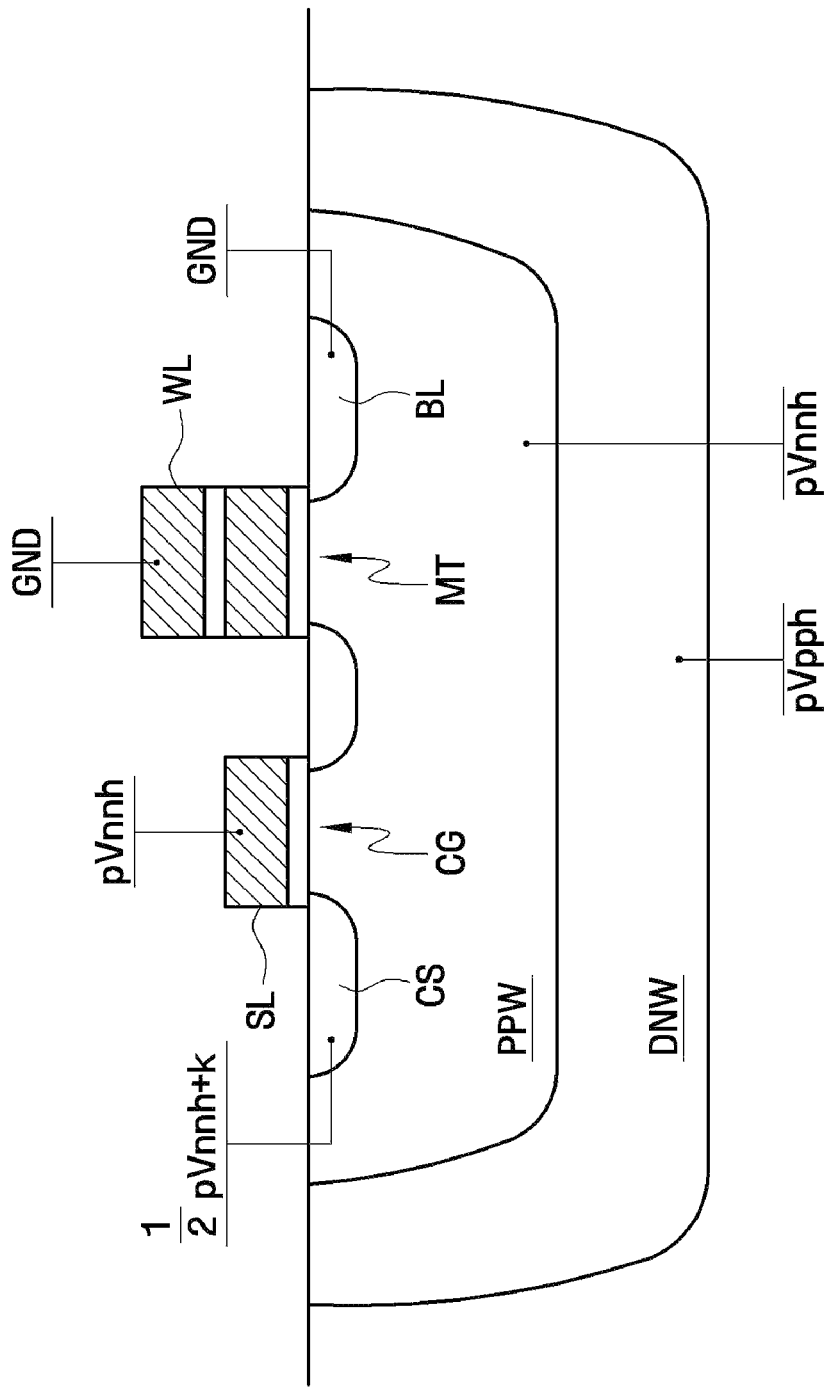

FIGS. 4 and 5 are diagrams for explaining disturbance characteristics of memory cells adjacent to selected memory cells to be programmed in a program operation of the non-volatile memory device in accordance with the embodiment of the inventive concept.

In the program operation, control circuit 70 directly or indirectly controls row selector 30, column selector 40, read-write circuit 50, buffer 60, and voltage generator 80 to apply voltages shown in the following Table 1 to memory cell array 10.

TABLE 1

| Program | PPW | GCL (SL) | WL | CS | BL | SSG | BSG | DNW |
|---------|------|----------|------|-----------|------|------|------|------|
| Select | pVnnh | pVpph | pVnnh | ½pVnnh | pVnnh | pVppm | pVnnm | pVpph |
| Unselect | GND | GND | pVnnh | ½pVnnh + k | GND | pVnnh | pVpph | pVpph |

Supposing that, e.g., first memory cell MC1 is programmed, a first voltage (e.g., ½pVnnh) is applied to first common source line CS0, and a second voltage (e.g. ½pVnnh+k) is applied to common source lines CS1 through CS(m−1)/2. At the same time, common source driver 20 applies the first voltage (e.g., ½pVnnh) to first common source line CS0 and applies the second voltage (e.g. ½pVnnh+k) to common source lines CS1 to CS(m−1)/2.

A third voltage (e.g., pVnnh) is applied to all word lines WL0 through WL(m−1), including first through fourth word lines WL0 through WL3. A fourth voltage (e.g., pVpph) is applied to first selection line SL0. A ground voltage GND is applied to other selection lines SL1 through SL(m−1).

Meanwhile, the third voltage (e.g., pVnnh) is applied to first bit line BL0, and ground voltage GND is applied to other bit lines BL1 through BL(n−1). The fourth voltage (e.g., pVpph) is applied to deep well DNW. The third voltage (e.g., pVnnh) is applied to pocket well PPW including first memory cell MC1, and ground voltage GND is applied to other pocket wells PPW.

In this example, the magnitude of the first voltage (e.g., ½pVnnh) applied to first common source line CS0 is different from that of the second voltage (e.g. ½pVnnh+k) applied to the other common source lines CS1 through CS(m−1)/2. Specifically, the magnitude of the first voltage (e.g., ½pVnnh) is smaller than the magnitude of the second voltage (e.g. ½pVnnh+k). Where the magnitude of the first voltage (e.g., ½pVnnh) is negative, "k" can be negative, and where the magnitude of the first voltage (e.g., ½pVnnh) is positive, "k" can be positive.

Meanwhile, the magnitude of the first voltage (e.g., ½pVnnh) can be half of a magnitude of the third voltage (e.g., pVnnh) applied to all word lines WL0 to WL(m−1) including first through fourth word lines WL0 through WL3 and first bit line BL0.

Where the common source lines of memory cell array 10 are formed separately from each other and the above voltages are applied to memory cell array 10, because the first voltage (e.g., ½pVnnh) is applied to first common source line CS0, the voltages as shown in FIG. 4 are applied to the memory cells included in region A. As shown in FIG. 4, because the first voltage (e.g., ½pVnnh) is applied to common source line CS, it is possible to more efficiently prevent punch-through of control gate CG compared to examples in which common source line CS is floating. This can result in reduction of punch leakage, thereby improving disturbance characteristics of the memory cells included in region A.

Meanwhile, because the second voltage (e.g. ½pVnnh+k) is applied to common source lines CS1 through CS(m−1)/2, voltages as shown in FIG. 5 are applied to the memory cells included in a region B of FIG. 2. As depicted in FIG. 5, in this case, because the second voltage (e.g. ½pVnnh+k) is applied to common source line CS and the third voltage (e.g., pVnnh) is applied to pocket well PPW, punch-through may be generated at control gate CG compared to a case in which common source line CS is floating. Accordingly, it is possible to prevent gate induced drain leakage (GIDL), thereby improving disturbance characteristics of the memory cells included in region B.

As indicated by the foregoing, it is possible to improve the disturbance characteristics of memory cells adjacent to a selected memory cell, where the adjacent memory cells and the selected memory cell share word line WL, selection line SL, or pocket well PPW. Accordingly, it is possible to enhance the reliability of the non-volatile memory device.

Although the programming first memory cell MC1 of FIG. 2 has been presented as an example, the above description can be applied to other memory cells in the memory cell array.

Figure 6:
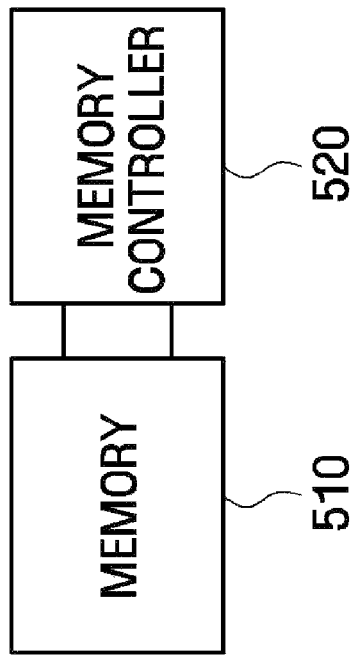
FIGS. 6 through 8 are block diagrams illustrating non-volatile memory systems in accordance with various embodiments of the inventive concept.
Figure 7:
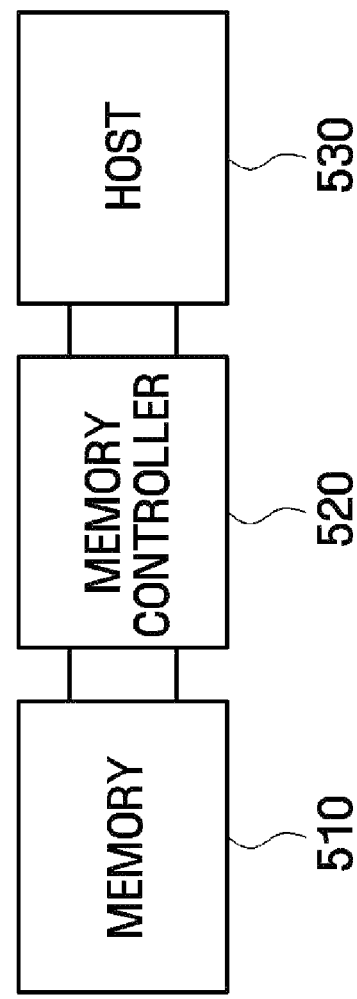
Figure 8:
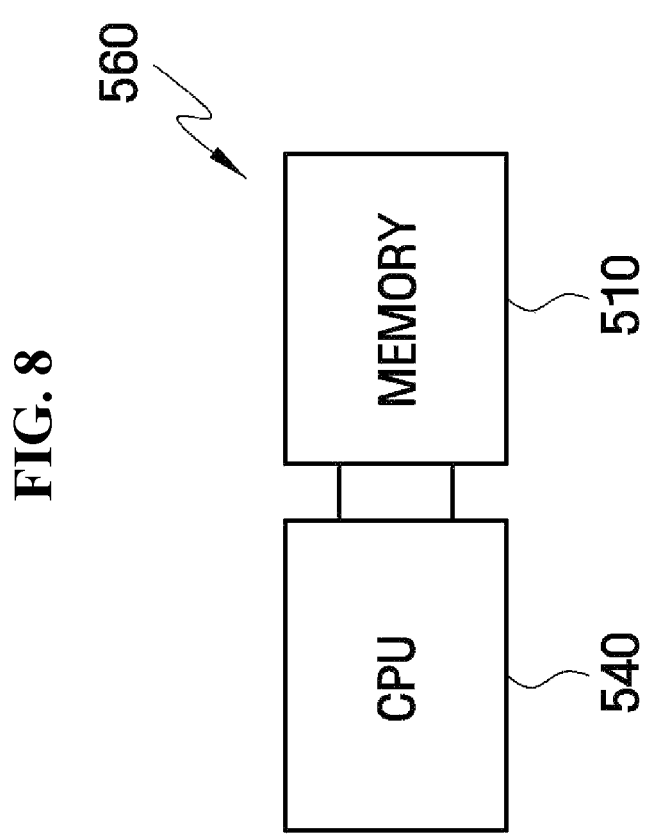

FIGS. 6 through 8 are block diagrams illustrating non-volatile memory systems in accordance with various embodiments of the inventive concept.

Referring to FIG. 6, a non-volatile memory system comprises a memory 510 and a memory controller 520 connected to memory 510. Memory 510 comprises a non-volatile memory device such as those described above. Accordingly, it can provide improved reliability by improving disturbance characteristics of memory cells adjacent to a selected memory cell, where the selected memory cell and the adjacent memory cells share word line WL, selection line SL, or pocket well PPW. Memory controller 520 provides input signals to memory 510, such as address signals and command signals, to control operations such as read and write operations.

The non-volatile memory system including memory 510 and memory controller 520 can be embodied in a card such as a memory card. Moreover, in certain embodiments, the system can be embodied in a card that satisfies an industry standard and is used in an electronic device such as a mobile phone, a two-way communication system, a one-way pager, a two-way pager, a personal communication system, a portable computer, a personal data assistant (PDA), an audio and/or video player, a digital and/or video camera, a navigation system, or a global positioning system (GPS). The non-volatile memory system can also take other forms, such as a memory stick.

Referring to FIG. 7, a non-volatile memory system in accordance with another embodiment of the inventive concept comprises memory 510, memory controller 520, and a host system 530. Host system 530 is connected to memory controller 520 via a bus or similar interface, and provides control signals to memory controller 520 so that memory controller 520 can control operations of memory 510. Host system 530 can be, for instance, a processing system used in a mobile phone, a two-way radio communication system, a one-way pager, a two-way pager, a personal communication system, a portable computer, a PDA, an audio and/or video player, a digital and/or video camera, a navigation system, or a GPS.

Although in FIG. 7 memory controller 520 is interposed between memory 510 and host system 530, it is not limited thereto, and memory controller 520 can be selectively omitted in a system in accordance with still another embodiment of the inventive concept.

Referring to FIG. 8, a non-volatile memory system in accordance with still another embodiment of the inventive concept takes the form of a computer system 560 comprising a central processing unit (CPU) 540 and memory 510. In computer system 560, memory 510 is connected to CPU 540 directly or through a computer bus architecture. In this configuration, memory 510 typically stores an operation system (OS) instruction set, a basic input/output start up (BIOS) instruction set, and an advanced configuration and power interface (ACPI) instruction set. Memory 510 can also be used as a large-capacity storage device such as a solid state disk (SSD).

Although not shown in FIG. 8, computer system 560 typically comprises many additional components. In addition, for convenience of explanation, memory controller 520 is omitted from FIG. 8. However, memory controller 520 may be interposed between memory 510 and CPU 540 in some embodiments.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims. The exemplary embodiments should be considered in a descriptive sense only and not for purposes of limitation.

What is claimed is:

1. A non-volatile memory cell array, comprising:
sector selection transistors controlled by a voltage applied to sector selection lines;
first through fourth memory cells connected in series to the sector selection transistors;
a first common source line connected between the first memory cell and the second memory cell; and
a second common source line connected between the third memory cell and the fourth memory cell and separated from the first common source line,
wherein a first voltage is applied to the first common source line, and a second voltage different from the first voltage is applied to the second common source line,
wherein each of the memory cells comprises a memory transistor controlled by a voltage applied to the selection lines and a control gate controlled by a voltage applied to the word lines and connected in series to the memory transistor,
wherein the memory cells comprise first through fourth memory cells connected in series to each other while sharing a bit line,
the word lines comprise first through fourth word lines connected to control gates of the first through fourth memory cells, respectively,
the selection lines comprise first through fourth selection lines connected to memory transistors of the first through fourth memory cells, respectively,
the common source lines comprise first and second common source lines,
the first common source line is connected between the control gate of the first memory cell and the control gate of the second memory cell, and
the second common source line is connected between the control gate of the third memory cell and the control gate of the fourth memory cell,
wherein the first memory cell is programmed by applying the first voltage to the first common source line and the second voltage to the second common source line, applying a third voltage different from the first and second voltages to the first through fourth word lines and the bit line, applying a fourth voltage different from the first through third voltages to the first selection line, and applying a ground voltage to the second through fourth selection lines.

2. The non-volatile memory cell array of claim 1, wherein the first through fourth memory cells are programmed or erased by Fowler-Nordheim (F-N) tunneling.

3. The non-volatile memory cell array of claim 1, wherein the first voltage has a first magnitude and the second voltage has a second magnitude larger than the first magnitude.

4. The non-volatile memory cell array of claim 3, further comprising bit lines connected to the sector selection transistors, wherein the sector selection transistors are controlled by the voltage applied to the sector selection lines to apply a voltage applied to the bit lines to the first through fourth memory cells,
wherein the first magnitude is a half of a magnitude of the voltage applied to the bit lines.

5. A non-volatile memory device comprising:
a memory cell array comprising memory cells formed by arranging word lines, selection lines and bit lines, and common source lines separated from each other;
a common source driver that applies a first voltage to any one of the common source lines and applies a second voltage different from the first voltage to other common source lines;
a voltage generating circuit that supplies the first and second voltages to the common source driver; and
a control circuit that controls the voltage generating circuit and the common source driver,
wherein each of the memory cells comprises a memory transistor controlled by a voltage applied to the selection lines and a control gate controlled by a voltage applied to the word lines and connected in series to the memory transistor,
wherein the memory cells comprise first through fourth memory cells connected in series to each other while sharing a bit line,
the word lines comprise first through fourth word lines connected to control gates of the first through fourth memory cells, respectively,
the selection lines comprise first through fourth selection lines connected to memory transistors of the first through fourth memory cells, respectively, the common source lines comprise first and second common source lines, the first common source line is connected between the control gate of the first memory cell and the control gate of the second memory cell, and the second common source line is connected between the control gate of the third memory cell and the control gate of the fourth memory cell, wherein the first memory cell is programmed by applying the first voltage to the first common source line and the second voltage to the second common source line, applying a third voltage different from the first and second voltages to the first through fourth word lines and the bit line, applying a fourth voltage different from the first through third voltages to the first selection line, and applying a ground voltage to the second through fourth selection lines.

6. The non-volatile memory device of claim 5, wherein the memory cell array comprises a two-transistor (2T)-Fowler-Nordheim (FN)-NOR memory cell array.

7. The non-volatile memory device of claim 5, wherein a magnitude of the first voltage is smaller than a magnitude of the second voltage.

8. The non-volatile memory device of claim 5, wherein a magnitude of the first voltage is a half of a magnitude of the third voltage.

9. The non-volatile memory device of claim 5, wherein the source driver simultaneously applies the first voltage and the second voltage to the respective common source lines.

10. The non-volatile memory device of claim 5, wherein the common source lines are formed in parallel with the word lines and the selection lines.

11. The non-volatile memory device of claim 5, wherein a number of the common source lines in the memory cell array is a half of a number of the word lines in the memory cell array.

12. A non-volatile memory system comprising:
a non-volatile memory device and a memory controller that controls the non-volatile memory device,
wherein the non-volatile memory device comprises:
a memory cell array comprising memory cells;
word lines, selection lines and bit lines, and common source lines separated from each other;
a common source driver that applies a first voltage to one of the common source lines and a second voltage different from the first voltage to other common source lines;
a voltage generating circuit that supplies the first and second voltages to the common source driver; and
a control circuit that controls the voltage generating circuit and the common source driver,
wherein each of the memory cells comprises a memory transistor controlled by a voltage applied to the selection lines and a control gate controlled by a voltage applied to the word lines and connected in series to the memory transistor,
wherein the memory cells comprise first through fourth memory cells connected in series to each other while sharing a bit line,
the word lines comprise first through fourth word lines connected to control gates of the first through fourth memory cells, respectively,
the selection lines comprise first through fourth selection lines connected to memory transistors of the first through fourth memory cells, respectively,
the common source lines comprise first and second common source lines,
the first common source line is connected between the control gate of the first memory cell and the control gate of the second memory cell, and
the second common source line is connected between the control gate of the third memory cell and the control gate of the fourth memory cell,
wherein the first memory cell is programmed by applying the first voltage to the first common source line and the second voltage to the second common source line, applying a third voltage different from the first and second voltages to the first through fourth word lines and the bit line, applying a fourth voltage different from the first through third voltages to the first selection line, and applying a ground voltage to the second through fourth selection lines.

13. The non-volatile memory device of claim 12, wherein the memory cell array comprises a two-transistor (2T)-Fowler-Nordheim (FN)-NOR memory cell array.

14. The non-volatile memory device of claim 12, wherein the source driver simultaneously applies the first voltage and the second voltage to the respective common source lines.

15. The non-volatile memory device of claim 12, wherein a number of the common source lines of the memory cell array is half of a number of the word lines.

* * * * *